US011205492B2

(12) United States Patent
Kavalipurapu et al.

(10) Patent No.: US 11,205,492 B2
(45) Date of Patent: Dec. 21, 2021

(54) RESPONDING TO POWER LOSS

(71) Applicant: MICRON TECHNOLOGY, INC., Boise, ID (US)

(72) Inventors: Kalyan C. Kavalipurapu, Santa Clara, CA (US); Xiaojiang Guo, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/123,396

(22) Filed: Dec. 16, 2020

(65) Prior Publication Data
US 2021/0104284 A1    Apr. 8, 2021

Related U.S. Application Data

(63) Continuation of application No. 16/553,449, filed on Aug. 28, 2019, now Pat. No. 10,892,022.

(51) Int. Cl.
| | | |
|---|---|---|
| *G11C 16/04* | (2006.01) | |
| *G11C 16/30* | (2006.01) | |
| *G11C 16/08* | (2006.01) | |
| *G11C 16/26* | (2006.01) | |
| *G11C 16/10* | (2006.01) | |

(52) U.S. Cl.
CPC ............ *G11C 16/30* (2013.01); *G11C 16/08* (2013.01); *G11C 16/10* (2013.01); *G11C 16/26* (2013.01)

(58) Field of Classification Search
CPC ......... G11C 16/30; G11C 16/08; G11C 16/10; G11C 16/26
USPC ....................................................... 365/185.13
See application file for complete search history.

(56) References Cited

U.S. PATENT DOCUMENTS

| | | | |
|---|---|---|---|
| 2008/0279017 A1 | 11/2008 | Shimano et al. | |
| 2011/0179210 A1 | 7/2011 | Matano | |
| 2012/0188822 A1* | 7/2012 | Kwon | G11C 8/08 365/185.13 |
| 2013/0301373 A1 | 11/2013 | Tam | |
| 2014/0281135 A1 | 9/2014 | Balakrishnan et al. | |
| 2015/0303922 A1* | 10/2015 | Kwon | G11C 16/30 365/185.03 |
| 2018/0233204 A1 | 8/2018 | Lee | |

\* cited by examiner

*Primary Examiner* — Vu A Le
(74) *Attorney, Agent, or Firm* — Dicke, Billig & Czaja, PLLC

(57) ABSTRACT

Memories including an array of memory cells, a local access line connected to a plurality of memory cells of the array of memory cells, a global access line, a transistor connected between the global access line and the local access line, and an energy store either selectively connected to a control gate of the transistor, or selectively connected to a control gate of a different transistor connected between the control gate of the transistor and a voltage node configured to receive a reference potential.

20 Claims, 14 Drawing Sheets

RESPONDING TO POWER LOSS

RELATED APPLICATION

This application is a Continuation of U.S. application Ser. No. 16/553,449, titled "RESPONDING TO POWER LOSS," filed Aug. 28, 2019, (Allowed) which is commonly assigned and incorporated herein by reference.

TECHNICAL FIELD

The present disclosure relates generally to integrated circuit elements, and, in particular, in one or more embodiments, the present disclosure relates to methods and apparatus for responding to power loss.

BACKGROUND

Integrated circuit devices traverse a broad range of electronic devices. One particular type include memory devices, oftentimes referred to simply as memory. Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

Integrated circuit devices generally rely on a power supply having stable supply voltage levels for proper operation. If a device is powered down abruptly, or otherwise loses power in an uncontrolled manner, e.g., asynchronous power loss, the device may need to take action to discharge voltage levels within the device to mitigate information corruption, or even physical damage to the device itself.

DETAILED DESCRIPTION

Figure 1:
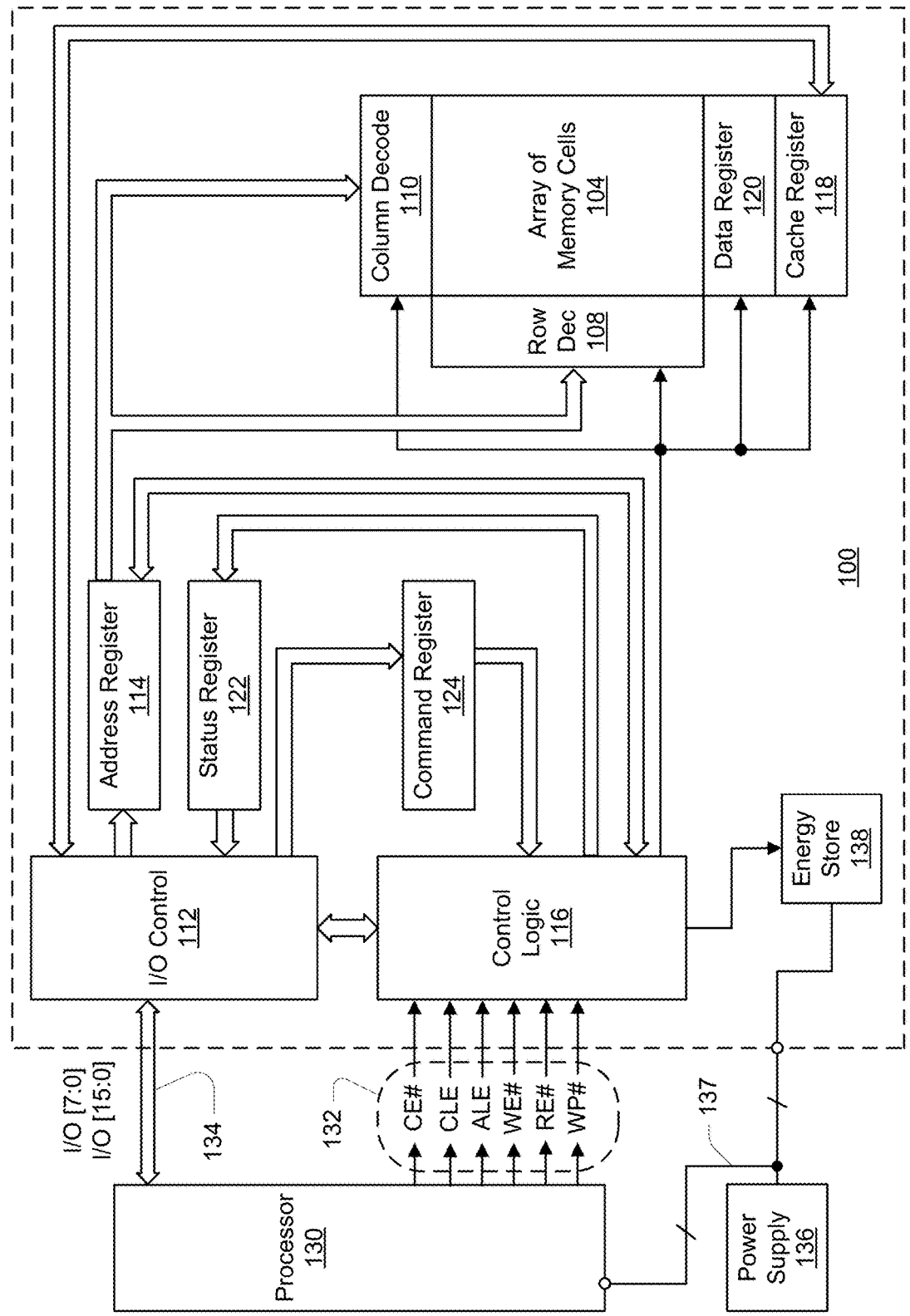
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting unless otherwise apparent from the context.

It is recognized herein that even where values may be intended to be equal, variabilities and accuracies of industrial processing and operation may lead to differences from their intended values. These variabilities and accuracies will generally be dependent upon the technology utilized in fabrication and operation of the integrated circuit device. As such, if values are intended to be equal, those values are deemed to be equal regardless of their resulting values.

When the memory is powered down abruptly or otherwise loses power in an uncontrolled manner, e.g., asynchronous power loss, it may be desirable to cease any access operations, and to discharge voltage levels of access lines to particular voltage levels selected to reduce stress on the memory. The discharge criteria might generally be dependent upon the architecture and materials of fabrication of the memory, and might be different for different access operations. For example, during a sense operation (e.g., read operation or program-verify operation), it might be desirable to reduce residual voltage levels to lower than 5V in order to mitigate read disturb. For a program operation, it might be desirable to reduce the residual voltage level of the selected access line to lower than 11V, while it might be desirable to reduce the residual voltage levels of the remaining unselected access lines to lower than 5V. However, due to process scaling and other factors, the available time to effect the desired levels of discharge may be generally decreasing.

For example, a voltage level of a supply voltage, e.g., the supply voltage Vcc, might have a desired operating range, that might be defined by an industry standard or otherwise. As one example, the supply voltage Vcc might have a specification calling for a nominal value of 3.3V, with a desired (e.g., acceptable) operating range of 2.7V-3.6V. Due to power loss or high power-demand operations, the internal supply may drop below the operating range (e.g., 2.7V to 3.6V). When the internal supply drops below a first threshold, e.g., 2.1V, the memory might start initiating a discharge sequence in response. Thus, for example, a memory might be configured to not respond to a power loss until the voltage level of the supply voltage falls to some first threshold lower than its operating range. However, operation of the memory may become unstable below a second, lower, threshold, e.g., 1.9V. If the operating range of the supply voltage is increased, e.g., from 2.35V to 3.6V, the internal supply might have little margin to the first threshold. The first threshold can be lowered, e.g., to 2V, to give more margin for supply fluctuations due to chip operations before initiating discharge. However, the second threshold generally cannot be lowered. This in turn translates to shorter time available to effect the discharge of access lines to the desired levels. As process scaling might generally lead to increased levels of resistive and capacitive effects on access lines, the time necessary to effect the desired level of discharge might generally increase. Various embodiments seek to mitigate these compounding factors by facilitating an increase in the effective range of voltage levels of the supply voltage over which discharge might occur.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like.

The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two target data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and generates status information for the external processor 130, i.e., control logic 116 is configured to perform access operations (e.g., sensing operations [which may include read operations and verify operations], programming operations and/or erase operations) on the array of memory cells 104, and might be configured to perform methods in accordance with embodiments. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data may be passed from the cache register 118 to the data register 120 for transfer to the array of memory cells 104; then new data may be latched in the cache register 118 from the I/O control circuitry 112. During a read operation, data may be passed from the cache register 118 to the I/O control circuitry 112 for output to the external processor 130; then new data may be passed from the data register 120 to the cache register 118. The cache register 118 and/or the data register 120 may form (e.g., may form a portion of) a page buffer of the memory device 100. A page buffer may further include sensing devices (not shown in FIG. 1) to sense a data state of a memory cell of the array of memory cells 104, e.g., by sensing a state of a data line connected to that memory cell. A status register 122 may be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands may be received over input/output (I/O) pins [7:0] of I/O bus 134 at I/O control circuitry 112 and may then be written into command register 124. The addresses may be received over input/output (I/O) pins [7:0] of I/O bus 134 at I/O control circuitry 112 and may then be written into address register 114. The data may be received over input/output (I/O) pins [7:0] for an 8-bit device or input/output (I/O) pins [15:0] for a 16-bit device at I/O control circuitry 112 and then may be written into cache register 118. The data may be subsequently written into data register 120 for programming the array of memory cells 104. For another embodiment, cache register 118 may be omitted, and the data may be written directly into data register 120. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 100 by an external device (e.g., processor 130), such as conductive pads or conductive bumps as are commonly used.

Memory device 100 and/or processor 130 may receive power from a power supply 136. Power supply 136 may represent any combination of circuitry for providing power to memory device 100 and/or processor 130. For example, power supply 136 might include a stand-alone power supply (e.g., a battery), a line-connected power supply (e.g., a switched-mode power supply common in desktop computers and servers or an AC adapter common for portable electronic devices), or a combination of the two. Power is typically received from the power supply 136 using two or more supply voltage nodes 137, such as a supply voltage node (e.g., Vcc or Vccq) and a reference voltage node (e.g., Vss or Vssq, such as ground or 0V). It is not uncommon for a power supply 136 to provide more than two supply voltage nodes 137.

Memory device 100 may include an energy store 138 connected to receive, and store, power from a supply voltage node 137. For example, the energy store 138 might be connected to receive Vcc during normal operation of the memory device 100. For simplicity, distribution of power from the supply voltage nodes 137 to other components within the memory device 100 is not depicted. Similarly, distribution of power from the energy store 138 to other components within the memory device 100 is not depicted in FIG. 1. The energy store 138 might represent a capacitance, e.g., a capacitor. Alternatively, or in addition, the energy store 138 might represent a rechargeable battery or other circuitry configured to receive and store power from an external power supply. The energy store 138 might receive control signals from the control logic 116 for operation in accordance with embodiments.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) may be used in the various embodiments.

Figure 2A:
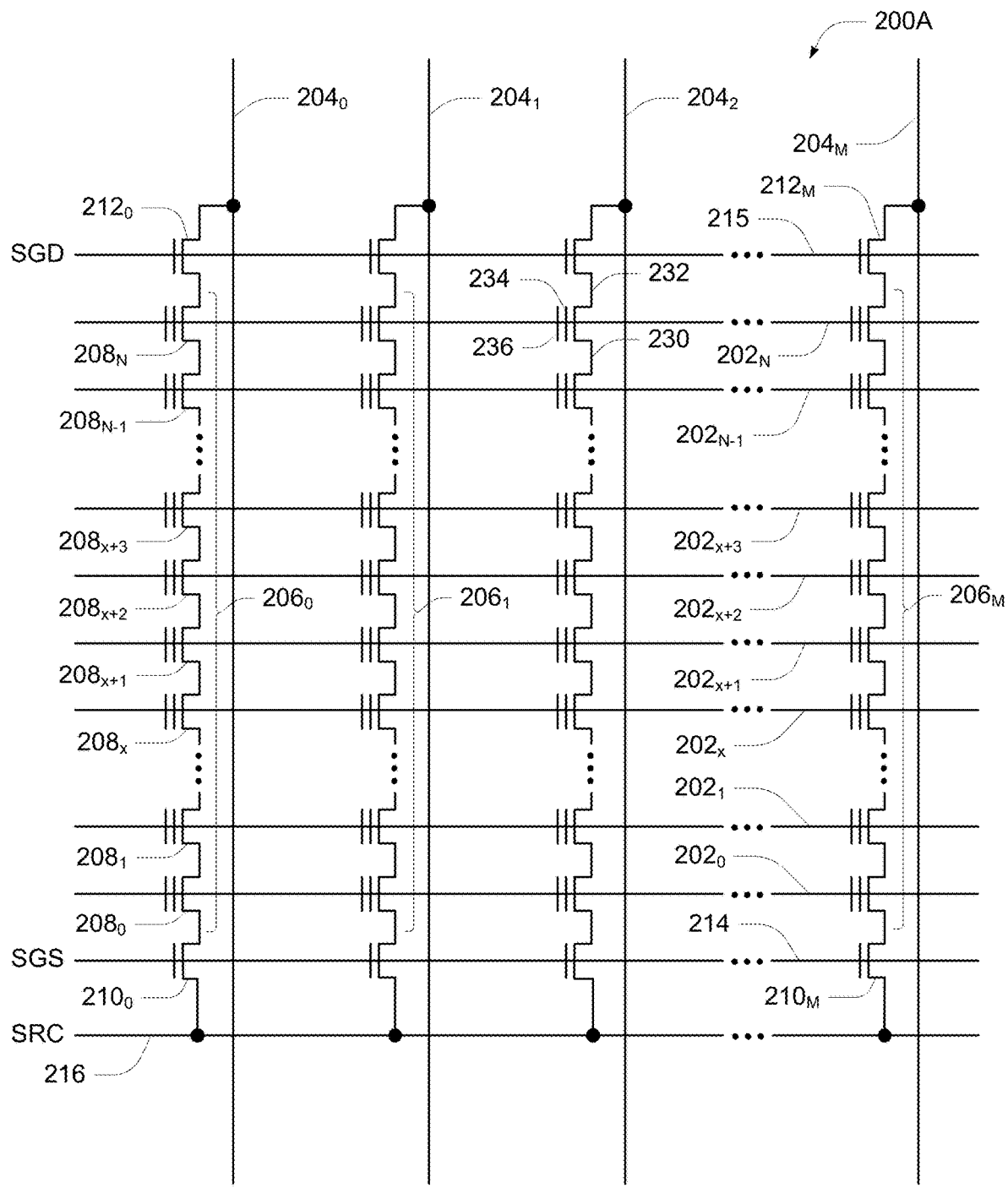
FIGS. 2A-2C are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines, such as word lines $202_0$ to $202_N$, and data lines, such as bit lines $204_0$ to $204_M$. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 may represent non-volatile memory cells for storage of data. The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 may utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding bit line 204. A control gate of each select gate 212 might be connected to select line 215.

The memory array in FIG. 2A might be a quasi-two-dimensional memory array and might have a generally planar structure, e.g., where the common source 216, NAND strings 206 and bit lines 204 extend in substantially parallel planes. Alternatively, the memory array in FIG. 2A might be a three-dimensional memory array, e.g., where NAND strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, or other structure configured to store charge) that can determine a data state of the memory cell (e.g., through changes in threshold voltage), and a control gate 236, as shown in FIG. 2A. The data-storage structure 234 may include both conductive and dielectric structures while the control gate 236 is generally formed of one or more conductive materials. In some cases, memory cells 208 may further have a defined source/drain (e.g., source) 230 and a defined source/drain (e.g., drain) 232. Memory cells 208 have their control gates 236 connected to (and in some cases form) a word line 202.

A column of the memory cells 208 may be a NAND string 206 or a plurality of NAND strings 206 selectively connected to a given bit line 204. A row of the memory cells 208 may be memory cells 208 commonly connected to a given word line 202. A row of memory cells 208 can, but need not, include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS or other data storage structure configured to store charge) and other architectures (e.g., AND arrays, NOR arrays, etc.).

Figure 2B:
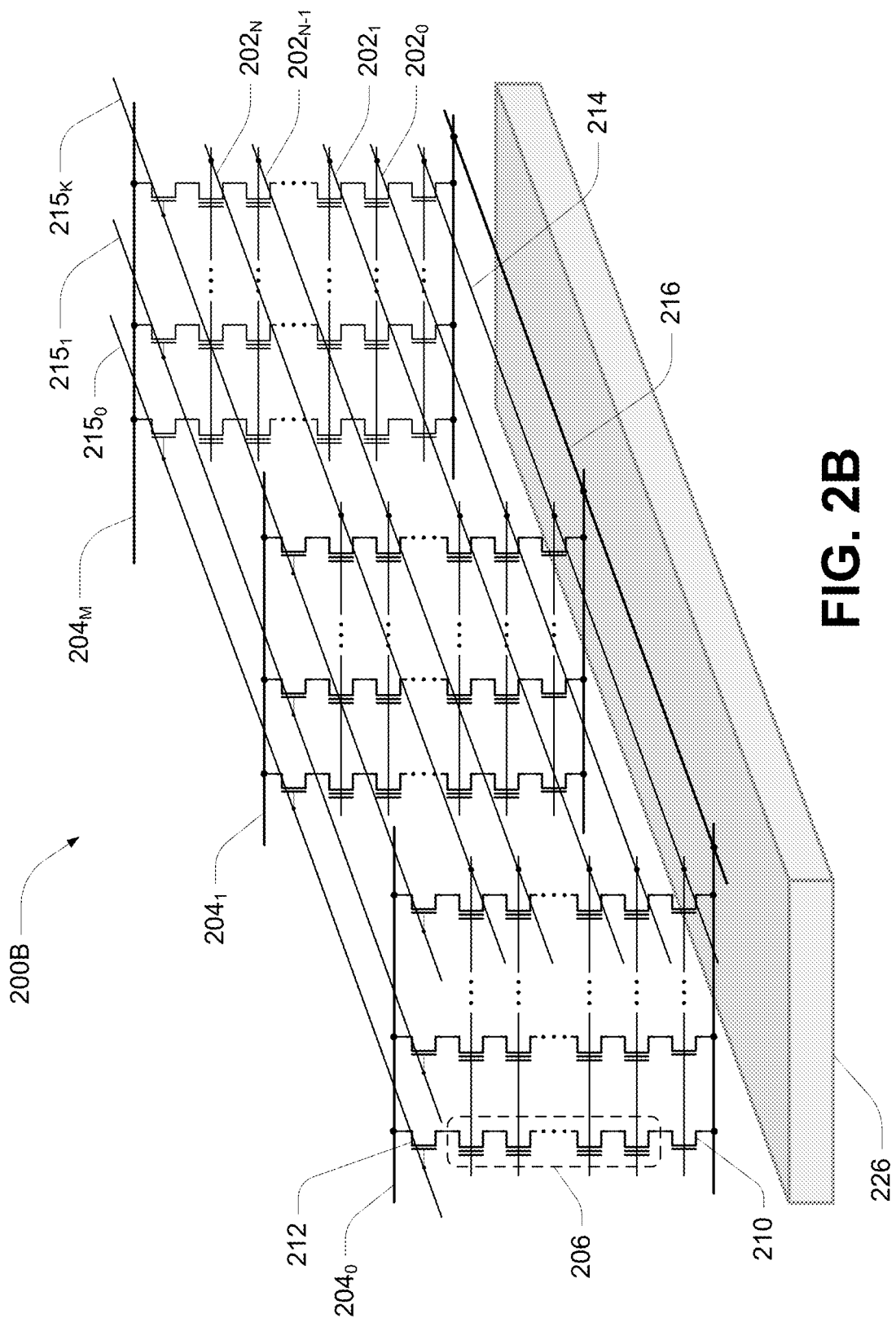

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

The three-dimensional NAND memory array 200B might be formed over peripheral circuitry 226. The peripheral circuitry 226 might represent a variety of circuitry for accessing the memory array 200B. The peripheral circuitry 226 might include complementary circuit elements. For example, the peripheral circuitry 226 might include both n-channel and p-channel transistors formed on a same semiconductor substrate, a process commonly referred to as CMOS, or complementary metal-oxide-semiconductors. Although CMOS often no longer utilizes a strict metal-oxide-semiconductor construction due to advancements in integrated circuit fabrication and design, the CMOS designation remains as a matter of convenience.

Figure 2C:
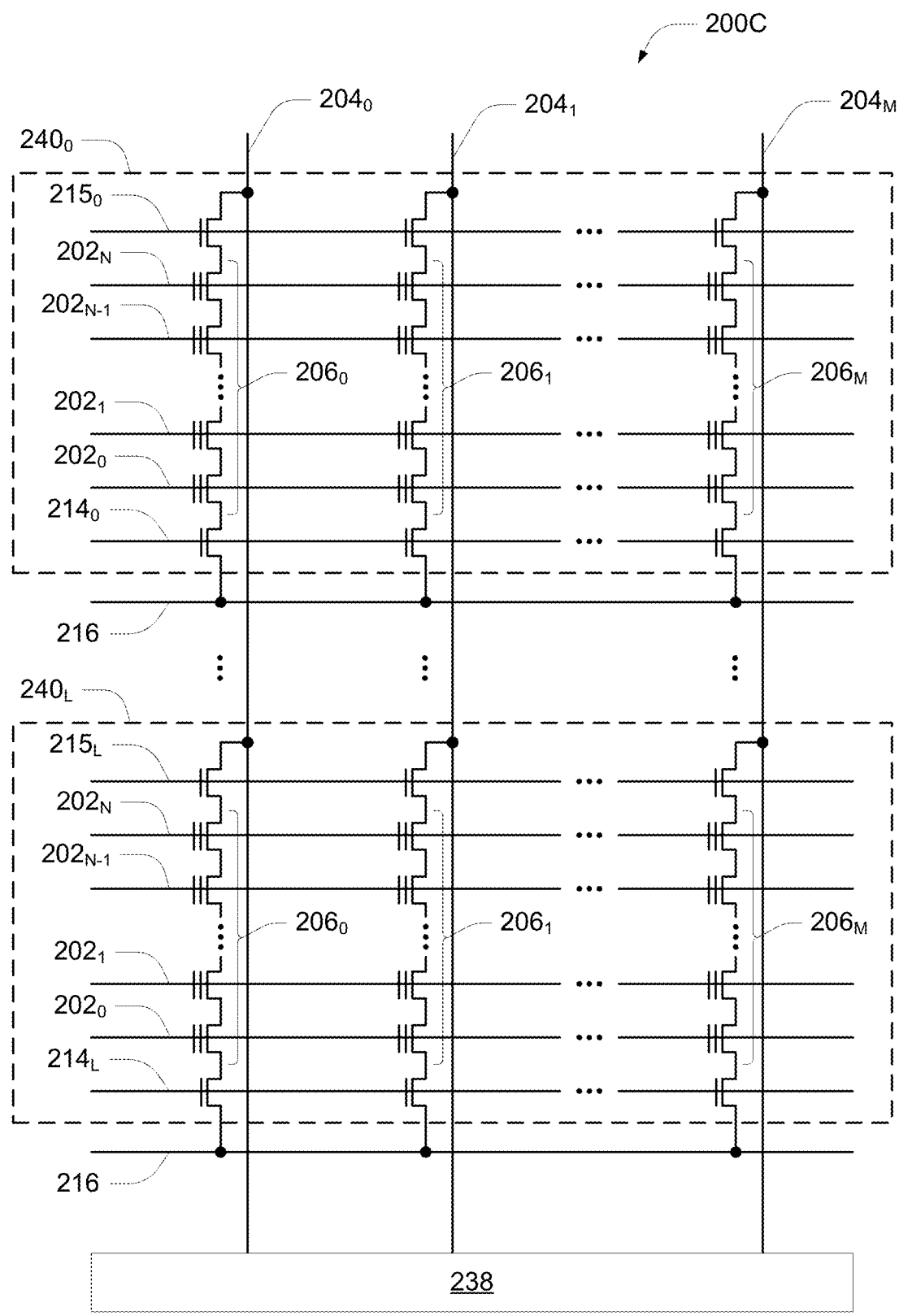

FIG. 2C is a further schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. Array of memory cells 200C may include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 2A. A portion of the array of memory cells 200A may be a portion of the array of memory cells 200C, for example. FIG. 2C depicts groupings of NAND strings 206 into blocks of memory cells 240, e.g., blocks of memory cells $240_0$-$240_L$. Blocks of memory cells 240 may be groupings of memory cells 208 that may be erased together in a single erase operation, sometimes referred to as erase blocks. Each block of memory cells 240 might include those NAND strings 206 commonly associated with a single select line 215, e.g., select line $215_0$. The source 216 for the block of memory cells $240_0$ might be a same source as the source 216 for the block of memory cells $240_L$. For example, each block of memory cells $240_0$-$240_L$ might be commonly selectively connected to the source 216. Access lines 202 and select lines 214 and 215 of one block of memory cells 240 may have no direct connection to access lines 202 and select lines 214 and 215, respectively, of any other block of memory cells of the blocks of memory cells $240_0$-$240_L$.

The data lines $204_0$-$204_M$ may be connected (e.g., selectively connected) to a buffer portion 238, which might be a portion of a data buffer of the memory. The buffer portion 238 might correspond to a memory plane (e.g., the set of blocks of memory cells $240_0$-$240_L$). The buffer portion 238 might include sense circuits (not shown in FIG. 2C) for sensing data values indicated on respective data lines 204.

While the blocks of memory cells 240 of FIG. 2C depict only one select line 215 per block of memory cells 240, the blocks of memory cells 240 might include those NAND strings 206 commonly associated with more than one select line 215. For example, select line $215_0$ of block of memory cells $240_0$ might correspond to the select line $215_0$ of the memory array 200B of FIG. 2B, and the block of memory cells of the memory array 200C of FIG. 2C might further include those NAND strings 206 associated with select lines $215_1$-$215_K$ of FIG. 2B. In such blocks of memory cells 240 having NAND strings 206 associated with multiple select lines 215, those NAND strings 206 commonly associated with a single select line 215 might be referred to as a sub-block of memory cells. Each such sub-block of memory cells might be selectively connected to the buffer portion 238 responsive to its respective select line 215.

Figure 3:
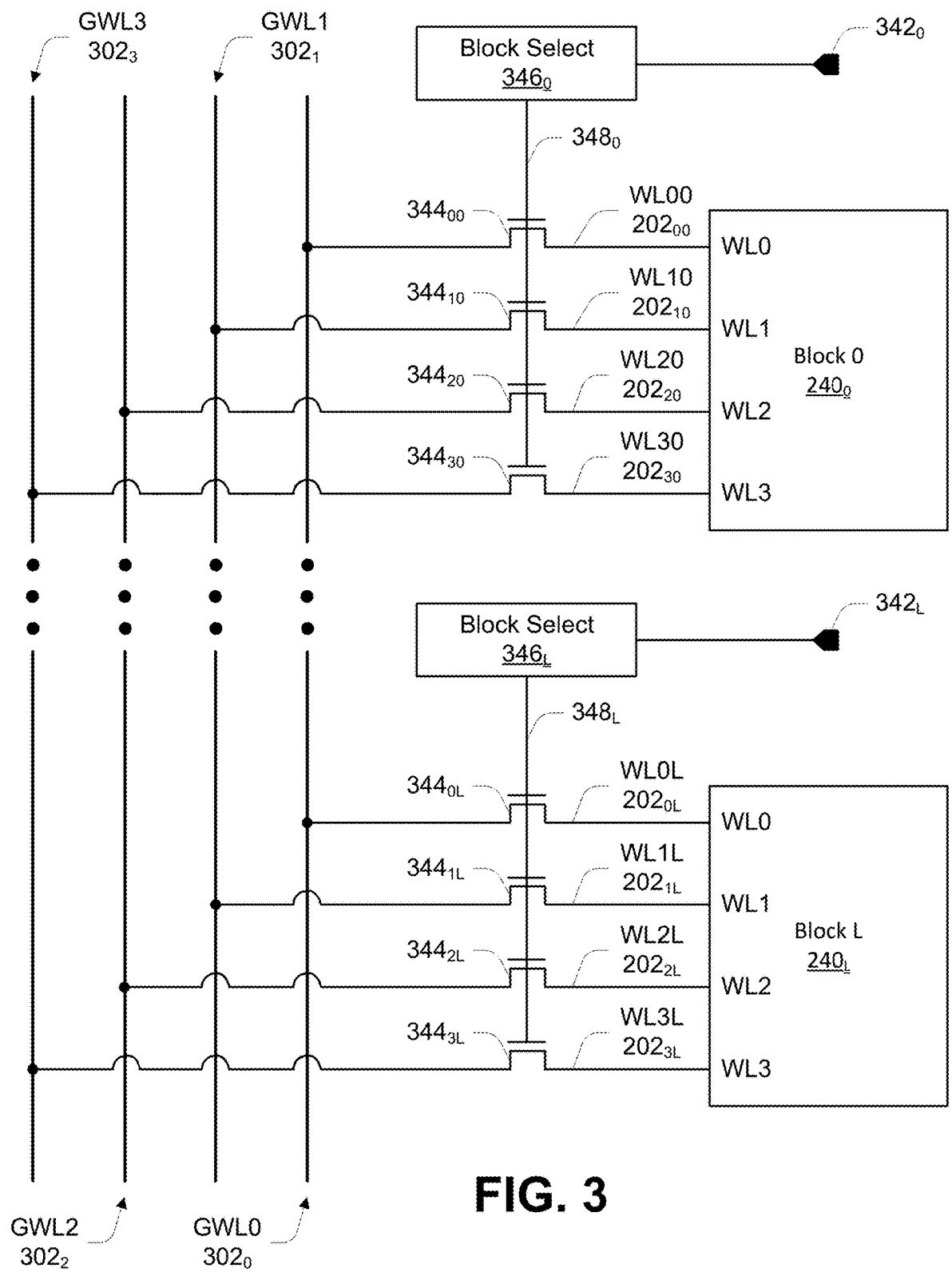
FIG. 3 is a schematic of a portion of an array of memory cells and string drivers as could be used in a memory device of the type described with reference to FIG. 1.

FIG. 3 is a schematic of a portion of an array of memory cells and string drivers as could be used in a memory device of the type described with reference to FIG. 1 and depicting a many-to-one relationship between local access lines (e.g., local word lines) 202 and global access lines (e.g., global word lines) 302.

As depicted in FIG. 3, a plurality of memory blocks 240 may have their local access lines 202 commonly selectively connected to a plurality of global access lines 302. Although FIG. 3 depicts only memory blocks $240_0$ and $240_L$ (Block 0 and Block L), additional memory blocks 240 may have their word lines 202 commonly connected to global access lines 302 in a like manner. Similarly, although FIG. 3 depicts only four word lines 202, memory blocks 240 may include fewer or more word lines 202.

To facilitate memory access operations to specific memory blocks 240 commonly coupled to a given set of global access lines 302, each memory block 240 may have a corresponding set of block select transistors 344 in a one-to-one relationship with their word lines 202. Control gates of the set of block select transistors 344 for a given memory block 240 may have their control gates commonly coupled to a corresponding block select line 348 receiving a control signal from corresponding block select circuitry 346 in response to an enable signal 342. For example, for memory block $240_0$, word line $202_{00}$ may be selectively connected to global access line $302_0$ through block select transistor $344_{00}$, word line $202_{10}$ may be selectively connected to global access line $302_1$ through block select transistor $344_{10}$, word line $202_{20}$ may be selectively connected to global access line $302_2$ through block select transistor $344_{20}$, and word line $202_{30}$ may be selectively connected to global access line $302_3$ through block select transistor $344_{30}$, while block select transistors $344_{00}$-$344_{30}$ are responsive to a control signal received on block select line $348_0$. The block select transistors 344 for a block of memory cells 240 might collectively be referred to as a string driver, or simply driver circuitry. The block select transistor 344 and the block select circuitry 346 might be distributed among the peripheral circuitry 226 of three-dimensional NAND memory array 200B of FIG. 2B, for example.

Each enable signal 342 might indicate whether its respective block of memory cells 240 is selected for an access operation, e.g., a read (or sense) operation, a programming (or write) operation, or an erase operation. For example, the enable signal 342 might have a first logic level (e.g., voltage level) when its respective block of memory cells 240 is selected for the access operation, and a second logic level (e.g., voltage level), different than the first logic level, when its respective block of memory cells 240 is not selected for the access operation.

Figure 4:
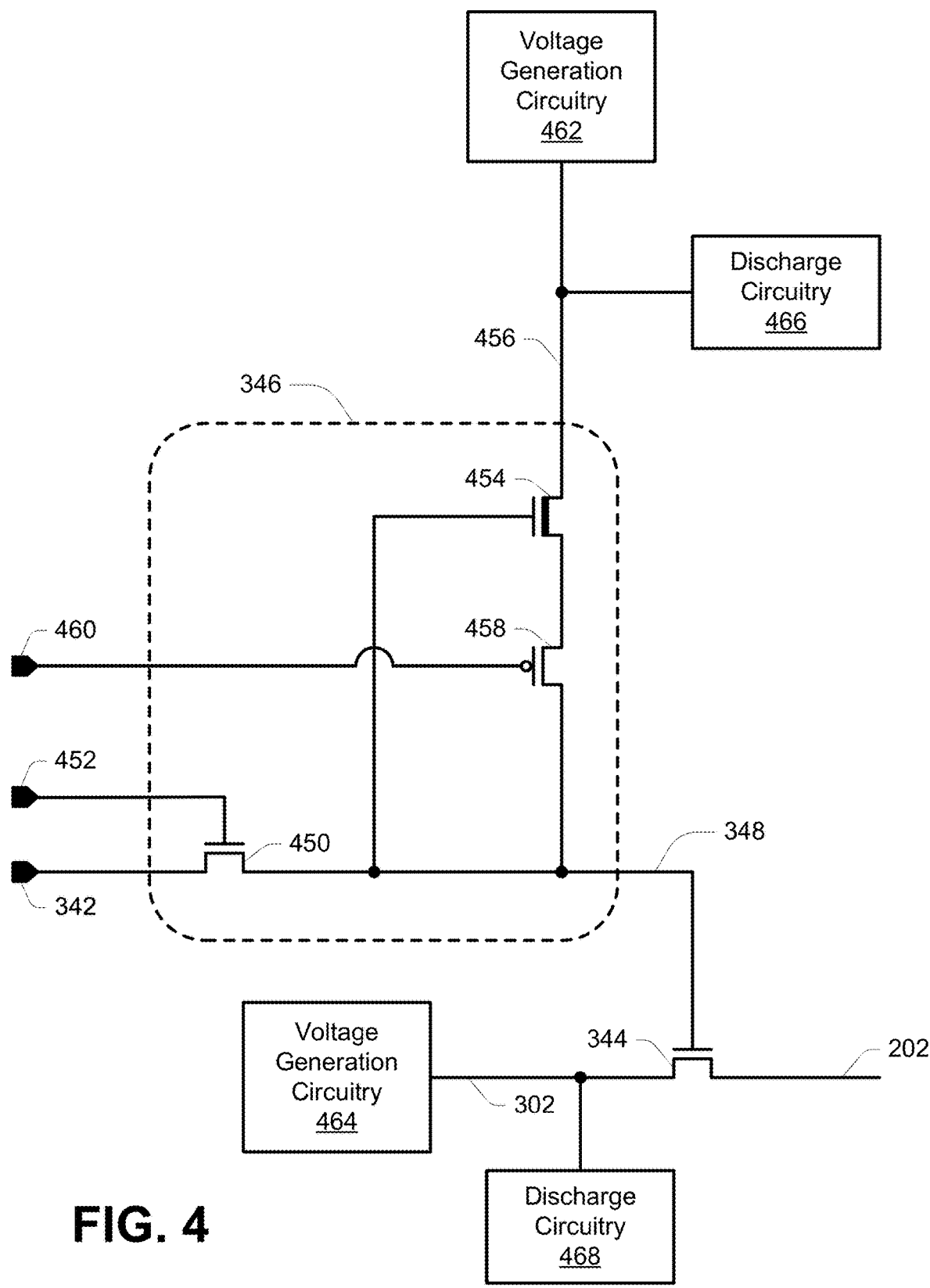
FIG. 4 is a schematic of block select circuitry as might be used with embodiments.

FIG. 4 is a schematic of block select circuitry 346 as might be used with embodiments. The block select circuitry 346 might include a first n-type field-effect transistor (nFET) 450 connected between an input of the block select circuitry 346 configured to receive the enable signal 342, and an output of the block select circuitry 346 configured to provide the control signal on the block select line 348. The first nFET 450 might be configured to receive (e.g., have its control gate connected to receive) a control signal 452. The block select circuitry 346 might further include a second nFET 454 connected between a voltage node 456 and a p-type field-effect transistor (pFET) 458. The second nFET 454 might have its control gate connected to the output of the block select circuitry 346. The pFET 458 might be connected between the second nFET 454 and the output of the block select circuitry 346. The pFET 458 might be configured to receive (e.g., have its control gate connected to receive) a control signal 460. The first nFET 450 might be a high-voltage nFET, the second nFET 454 might be a high-voltage depletion-mode nFET, and the pFET 458 might be a high-voltage pFET.

The control signal 452 might be configured to initially activate the first nFET 450 in response to the enable signal 342 having its first logic level, e.g., Vcc, and to deactivate the first nFET 450 as the voltage level of the control signal on the block select line 348 subsequently increases. For example, the voltage level of the control signal 452 might be sufficient to pass the enable signal 342 at Vcc. The control signal 460 might be initially configured to activate the pFET 458. For example, the voltage level of the control signal 460 initially might be the supply voltage Vss (e.g., ground or 0V). The positive feedback loop formed by the nFET 454 and the pFET 458 might be enabled due to the control gate of the nFET 454 being at Vcc and the control gate of the pFET 458 being at Vss, and might serve to increase the voltage level of the control signal on the block select line 348 to a voltage level near (e.g., equal to) the voltage level of the voltage node 456. As the voltage level of the control signal on the block select line 348 increases, the first nFET 450 may deactivate, thereby trapping the voltage level on the block select line 348.

If the enable signal 342 has its second logic level, e.g., Vss, the control signal 452 might again be configured to initially activate the first nFET 450. The control signal 460 might be initially configured to deactivate the pFET 458. The positive feedback loop formed by the nFET 454 and the pFET 458 might not be turned on due to the control gate of the nFET 454 being at Vss and the control gate of the pFET 458 being biased to deactivate it. This might cause the voltage level of the block select line 348 to not increase and remain at the same potential as the enable signal 342, e.g., which might be Vss.

The voltage node 456 might be connected to voltage generation circuitry 462 to receive a pass voltage. The pass voltage might represent a voltage level configured to sufficiently activate the block select transistor 344 to pass the voltage level of the global access line 302 to the local access line 202 when the enable signal has its first logic level, e.g., Vcc. For example, the pass voltage might be higher than the voltage level of the global access line 302 by at least the threshold voltage of the block select transistor 344. The voltage level of the global access line 302 might depend upon the access operation to be performed.

The voltage generation circuitry 462 might represent circuitry for generation of voltage levels desired for operation of the block select transistor 344. This might include, for example, charge pumps and voltage regulators. The voltage node 456 might further be connected to discharge circuitry 466. The discharge circuitry 466 might represent circuitry for discharge of voltage levels from the voltage node 456 as will be described infra. The global access line 302 might be connected to discharge circuitry 468. The discharge circuitry 468 might represent circuitry for discharge of voltage levels from the global access line 302 as will be described infra. Global access line 302 might further be connected to voltage generation circuitry 464 to generate its various voltage levels for access operations.

Figure 5:
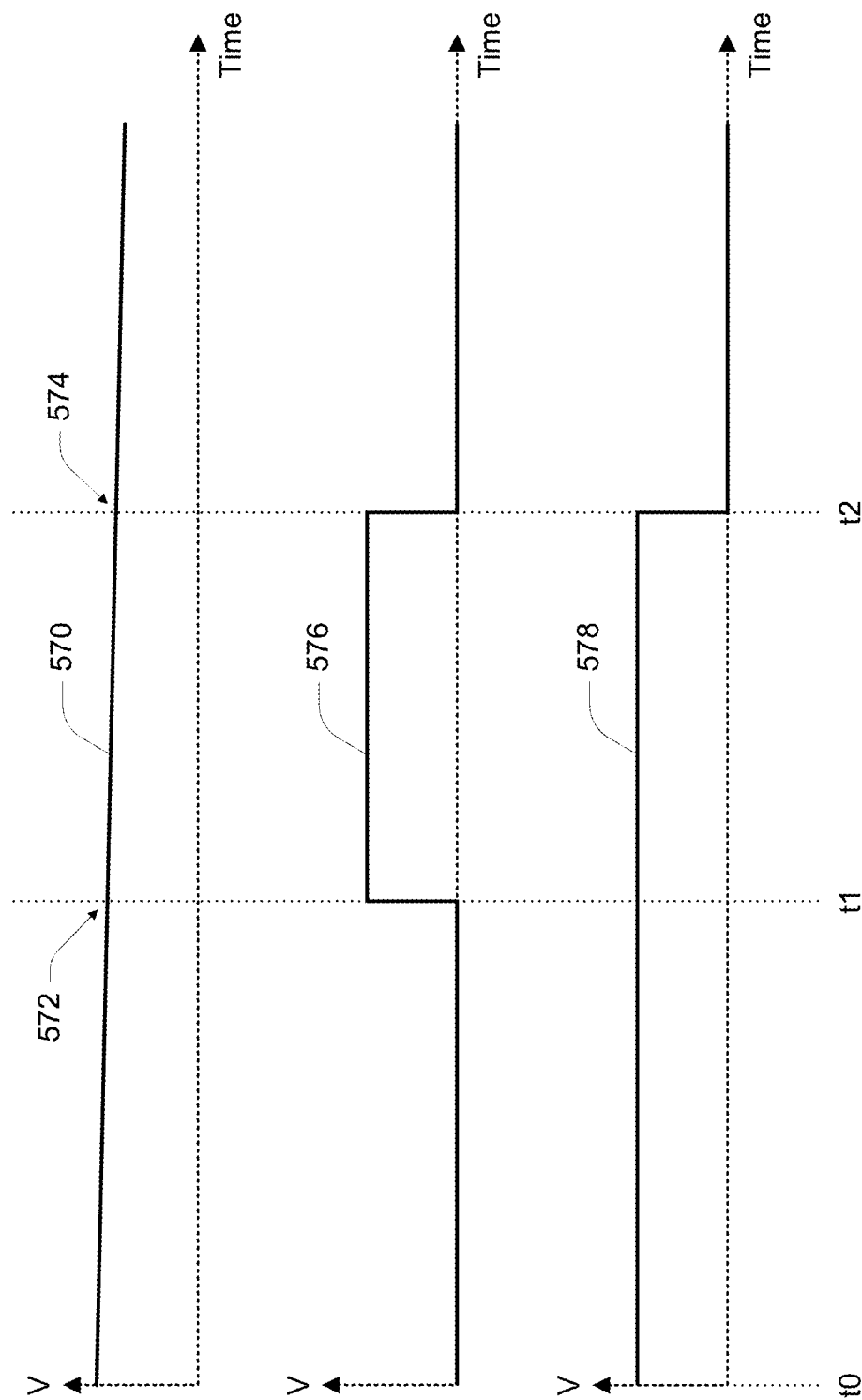
FIG. 5 depicts a timing diagram for control signals of the related art that might be generated in response to a decreasing voltage level of a supply voltage.

FIG. 5 depicts a timing diagram of control signals of the related art that might be generated in response to a decreasing voltage level of a supply voltage. Trace 570 might represent a decreasing voltage level of a supply voltage, e.g., the supply voltage Vcc. During asynchronous power loss, a supply voltage might be expected to decrease over time rather than immediately move to ground as it is typical for systems to incorporate a hold-up capacitance (not depicted) to avoid step changes in supply voltage level in the event of abrupt power loss. For larger systems, such as personal computers and the like, the size of the hold-up capacitance might not be restricted. However, in smaller systems, such as mobile phones and the like, the size of the hold-up capacitance might be constrained. Although unrelated to the scope of various embodiments, smaller sizes of hold-up capacitance might lead to a larger negative slope of trace 570.

The time t0 might correspond to a time when asynchronous power loss occurs. The time t1 might correspond to a time when the voltage level of trace 570 decreases to a first threshold 572, and the time t2 might correspond to a time when the voltage level of trace 570 further decreases to a second threshold 574. The first threshold 572 might correspond to a voltage level where a memory might transition from a first operating mode (e.g., a normal operating mode) to a second operating mode (e.g., a first power loss operating mode). The first threshold 572 might be selected to represent a point of trace 570 that is deemed to be no longer sufficient to reliably support access operations. The second threshold 574 might correspond to a voltage level where the memory might transition from the second operating mode to a third operating mode (e.g., a second power loss operating mode). The second threshold 574 might be selected to represent a point of trace 570 where it is deemed that the memory should be placed in a safe state, e.g., a state that would not result in lock-up if trace 570 continued to decrease, but was then restored.

Various apparatus, e.g., memories, might generate two control signals to indicate the status of the voltage level of trace 570. For example, trace 576 might represent the voltage levels of a first control signal having a first logic level (e.g., a logic low level) when the voltage level of trace 570 is above the first threshold 572, or below the second threshold 574. While the voltage level of trace 570 is between the first threshold 572 and the second threshold 574, the first control signal might have a second logic level (e.g., a logic high level). The first logic level might correspond to a reference potential, e.g., 0V, ground or Vss. The second logic level might correspond to a voltage level of a supply voltage, such as Vcc. In operation, trace 576 might have the first logic level while trace 570 has a voltage level higher than (or equal to) the first threshold 572. Trace 576 might transition to the second logic level in response to trace 570 having a voltage level lower than (or equal to) the first threshold 572 and higher than (or equal to) the second threshold 574. Trace 576 might transition back to the first logic level in response to trace 570 having a voltage level lower than (or equal to) the second threshold 574.

Trace 578 might represent the voltage levels of a second control signal having the second logic level when the voltage level of trace 570 is above the second threshold 574. While the voltage level of trace 570 is below the second threshold 574, the second control signal might have the first logic level. In operation, trace 578 might have the second logic level while trace 570 has a voltage level higher than (or equal to) the second threshold 574. Trace 578 might transition to the first logic level in response to trace 570 having a voltage level lower than (or equal to) the second threshold 574.

In this example, a memory might be in the first operating mode (e.g., a normal operating mode) at time t0 when the first control signal has the first logic level and the second control signal has the second logic level, e.g., in response to trace 570 maintaining a voltage level higher than (or equal to) the first threshold 572. The memory might initiate the second operating mode (e.g., a first power loss operating mode) at time t1 when the first control signal has the second logic level, e.g., in response to trace 570 decreasing to a voltage level lower than (or equal to) the first threshold 572 and higher than (or equal to) the second threshold 574. The memory might initiate the third operating mode (e.g., a second power loss operating mode) at time t2 when both the first control signal and the second control signal have the first logic level, e.g., in response to trace 570 decreasing to a voltage level lower than (or equal to) the second threshold 574.

In the prior art, a memory might initiate discharging of access lines upon initiating the second operating mode. For example, in block select circuitry 346 of the type depicted in FIG. 4, a memory of the prior art might set the control signal 342 to enable the block select circuitry 346, which might also correspond to a voltage level sufficient to activate the block select transistor 344. The memory of the prior art might further set the control signals 452 and 460 to activate the transistors 450 and 458, and begin discharging the global access line 302 to ground. In this manner, the block select transistor 344 might be activated, allowing the voltage level of the local access line 202 to discharge to the global access line 302. Upon initiating the third operating mode, the memory of the prior art might seek to put control devices of the memory in a known state as logic operation much below the second threshold 574 might be unpredictable and discharge the voltage node 456 to the supply voltage Vcc. This might include setting the control signal 342 to ground and setting the control signal 460 to deactivate the transistor 458, effectively deactivating the block select transistor 344, and ceasing any further discharge of the local access line 202. If the slope of trace 570 is too steep, this may retain excessive charge on the local access line 202 as there might be insufficient time for its discharge. Various embodiments might facilitate continuing to discharge the local access line 202 into the third operating mode.

Figure 6:
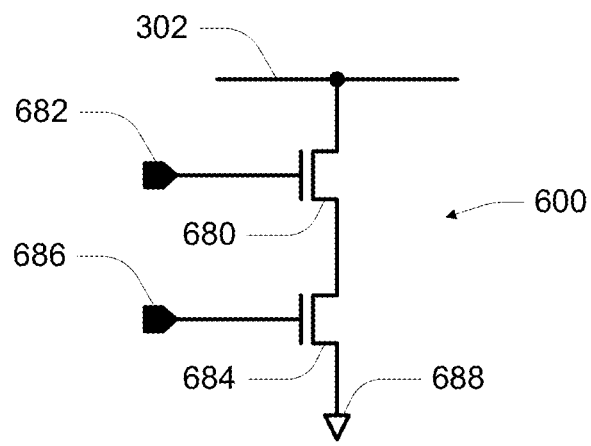
FIG. 6 depicts discharge circuitry of the related art.

In discharging the global access lines, selectively activated discharge paths might be common. FIG. 6 depicts discharge circuitry of the related art. The discharge circuitry 600 includes a first nFET 680 connected between a global access line 302 and a second nFET 684 connected between the first nFET 680 and a voltage node 688, which might be configured to receive the reference potential, such as Vss, ground or 0V. The nFET 680 might be configured to receive (e.g., have its control gate connected to receive) a control signal 682. The nFET 684 might be configured to receive (e.g., have its control gate connected to receive) a control signal 686.

The control signal 686 might be a supply voltage, such as Vcc, configured to activate the nFET 684. The control signal 682, when the discharge circuitry 600 is enabled to discharge the global access line 302, might be one or more voltage levels configured to activate the nFET 680. For example, the control signal 682 might initially correspond to a voltage level higher than the supply voltage Vcc, e.g., generated using voltage generation circuitry (e.g., which might include a charge pump), while the memory is in the second operating mode discussed in relation with FIG. 5. The control signal 682 might correspond to a regulated voltage level corresponding to (e.g., following) the supply voltage Vcc when the memory transitions to the third operating mode discussed in relation with FIG. 5. The nFETs 680 and 684 might be sized to support a discharge of the global access line 302 in the expected available time or less. Discharge circuitry of the type depicted in FIG. 6 might be used in conjunction with various embodiments. However, other discharge circuitry that can be selectively activated might also be used in conjunction with various embodiments.

Figure 7A:
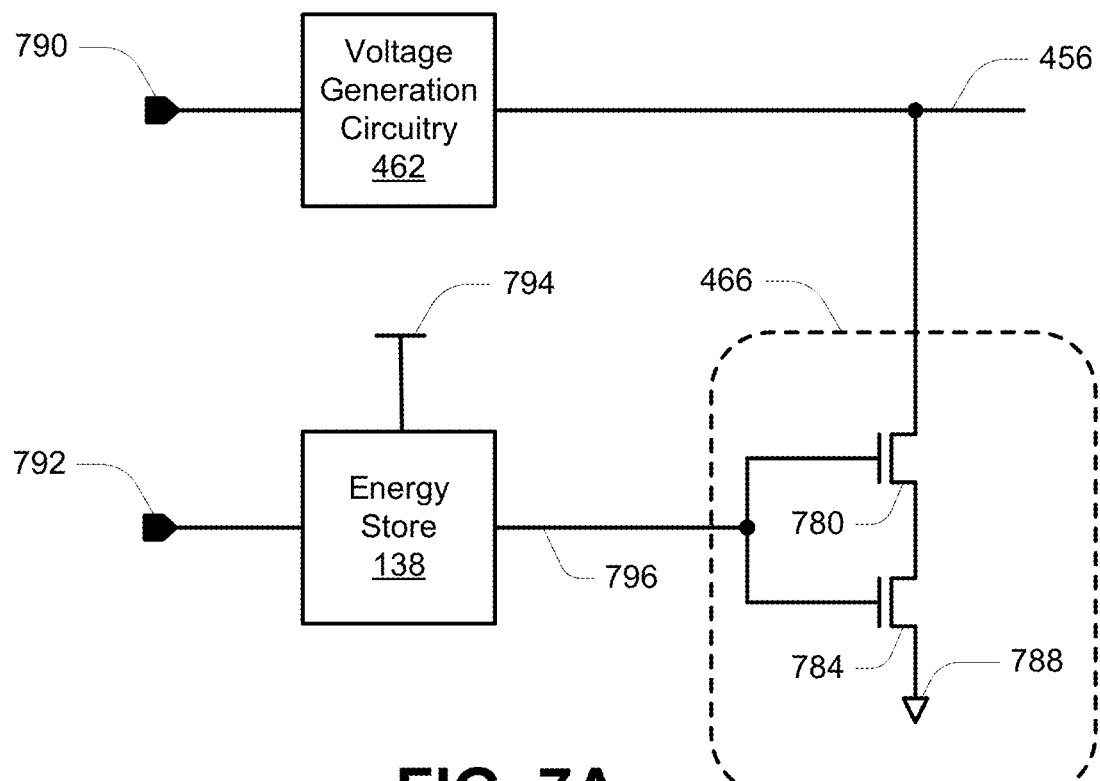
FIGS. 7A-7D depict circuitry for operation of discharge circuitry in accordance with embodiments.

FIGS. 7A-7D depict circuitry for operation of discharge circuitry in accordance with embodiments. In FIG. 7A, the discharge circuitry 466 is depicted to includes a first nFET 780 connected between the voltage node 456 and a second nFET 784 connected between the first nFET 780 and a voltage node 788, which might be configured to receive the reference potential, such as Vss, ground or 0V. The nFET 780 might be configured to receive (e.g., have its control gate connected to receive) a signal line 796. The nFET 784 might be configured to receive (e.g., have its control gate connected to receive) the signal line 796. The nFETs 780 and 784 might be sized to present a weaker discharge path than the nFETs 680 and 684 of FIG. 6, e.g., the nFETs 780 and 784 might be sized to support a discharge of the voltage node 456 in a time sufficient to fully discharge the global and local access lines or longer.

The signal line 796 might be selectively connected to the energy store 138 in response to a control signal 792, which might be generated by the control logic 116. The control signal 792 might represent a control signal of more than one digit of information, e.g., multiple control signals received on respective signal lines. The energy store 138 might further be selectively connected to a voltage node 794, which might be configured to receive the supply voltage Vcc, such as through a supply voltage node 137, in response to the control signal 792.

In operation, to discharge the voltage node 456 as depicted in FIG. 7A, and thus discharge the control gate of a block select transistor 344, the voltage generation circuitry 462 might be disconnected from (e.g., isolated from) the voltage node 456 in response to a control signal 790, which might be generated by the control logic 116. The energy store 138 might be connected to the discharge circuitry 466 through signal line 796 to provide a voltage level to activate the control gates of the nFETs 780 and 784.

Figure 7B:
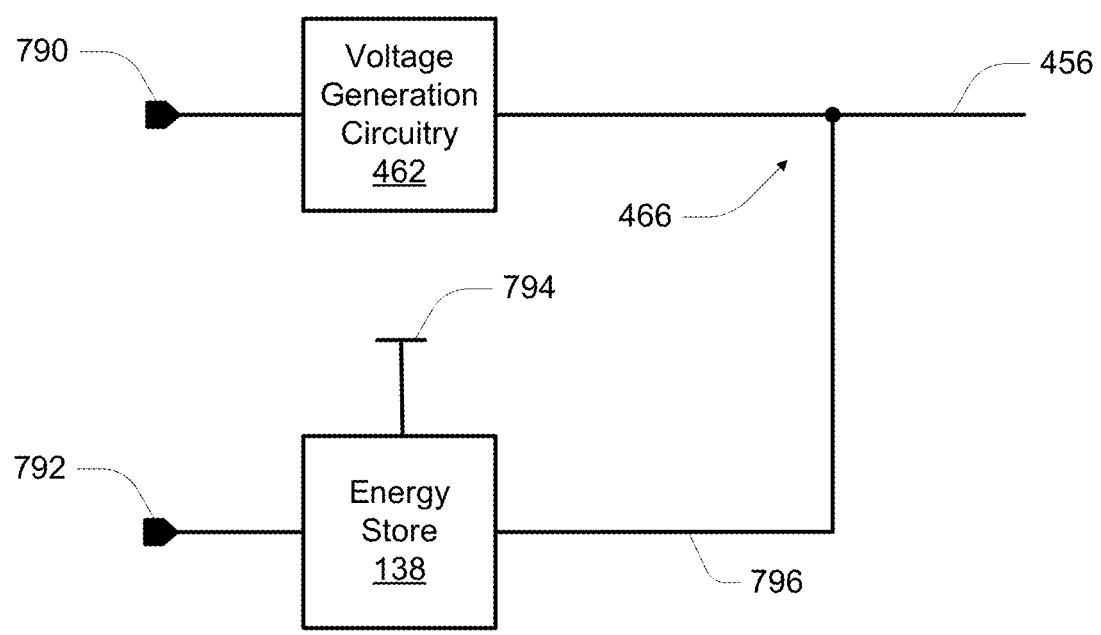

The schematic of FIG. 7B differs from FIG. 7A in that the discharge circuitry 466 might simply be a connection to the voltage node 456 that is selectively connected to the energy store 138. As the voltage node 456 would generally have a voltage level higher than the supply voltage Vcc during an access operation (e.g., a sense operation or a programming operation), connecting the voltage node 456 to the energy store 138 could serve to discharge the voltage node to a voltage level of the energy store 138, e.g., to a voltage level near Vcc.

Figure 7C:
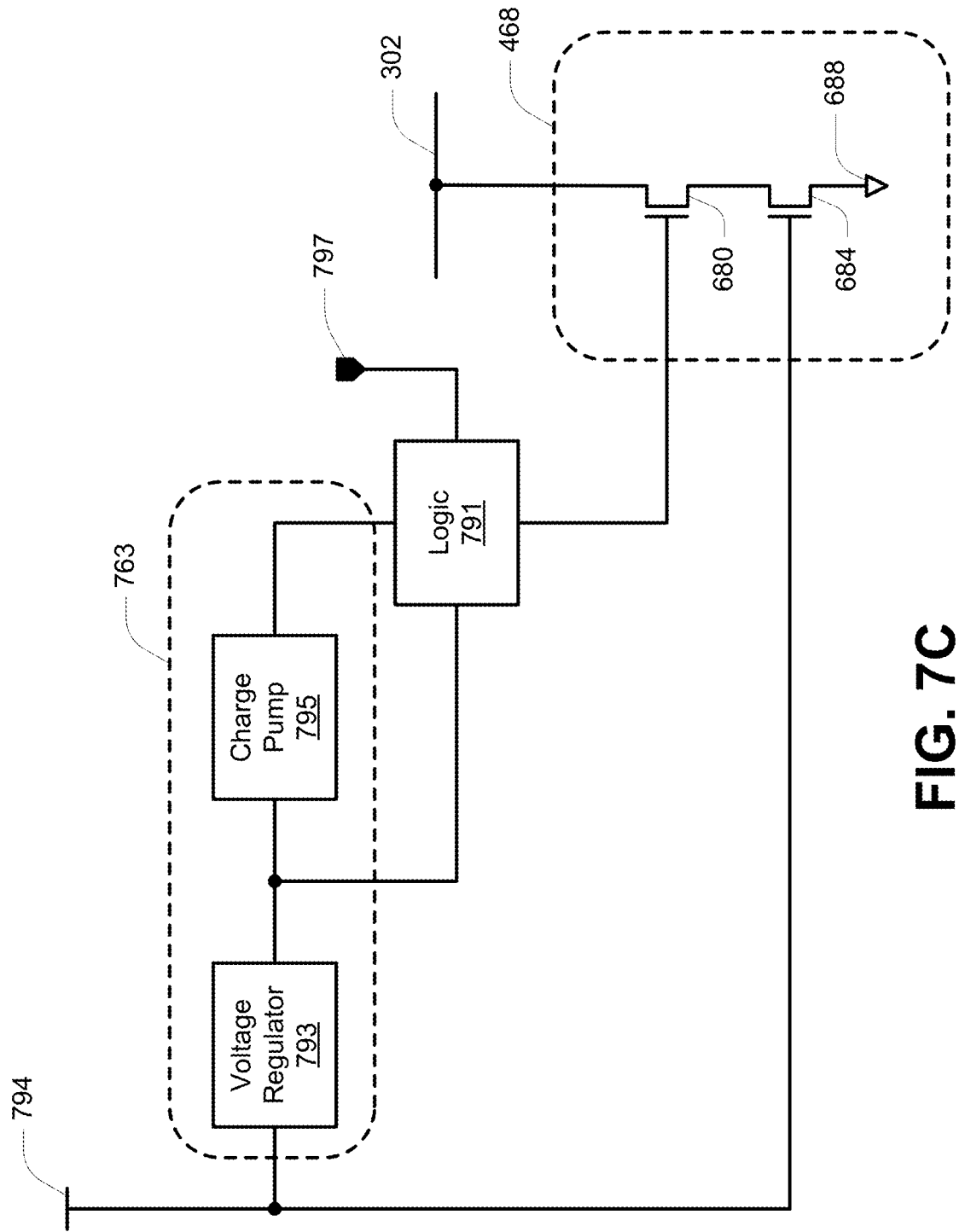

In FIG. 7C, the discharge circuitry 468 is depicted to includes a first nFET 680 connected between the global access line and a second nFET 684 connected between the first nFET 680 and a voltage node 688, which might be configured to receive the reference potential, such as Vss, ground or 0V. The nFET 680 might be configured to receive (e.g., have its control gate connected to receive) a control signal from logic 791. The nFET 684 might be configured to receive (e.g., have its control gate connected to receive) a control signal from the voltage node 794, which might be configured to receive the supply voltage Vcc.

FIG. 7C further depicts voltage generation circuitry 763, which might be used to provide a control signal for operation of the nFET 680. For example, the voltage generation circuitry 763 might have a voltage regulator 793 connected to the voltage node 794 to provide a regulated voltage as an input to a charge pump 795. The logic 791 might be connected to a node between the voltage regulator 793 and the charge pump 795, e.g., a regulated voltage node, to receive the voltage level output from the voltage regulator 793. The voltage regulator 793 might be configured to provide a regulated voltage generally following the voltage level of the supply voltage node 794. This might be desirable to provide a voltage level to the charge pump 795 with less noise than the external voltage might have. The charge pump 795 might be configured to generate an elevated voltage level in response to its input from the voltage regulator 793. The Logic 791 might further be connected to an output of the charge pump 795, e.g., a generated voltage node, to receive the voltage level generated by the charge pump 795. The logic 791 might be responsive to a control signal 797, which might be received from the control logic 116.

In operation, to discharge the global access line 302 as depicted in FIG. 7C, and thus discharge the corresponding local access line 202, the control signal 797 might have a value to select the voltage level from the output of the charge pump 795, e.g., from the generated voltage node, in response to the voltage level of the supply voltage node 794 decreasing to a voltage level lower than (or equal to) the first threshold. In response to the voltage level of the supply voltage node 794 decreasing (e.g., further decreasing) to a voltage level lower than (or equal to) the second threshold, the control signal 797 might have a value to select the voltage level from the output of the voltage regulator 793, e.g., from the regulated voltage node. For example, decreasing to the second threshold might indicate that operation of the charge pump 795 might soon become unstable, such that it might be desirable to switch to the regulated voltage.

Figure 7D:
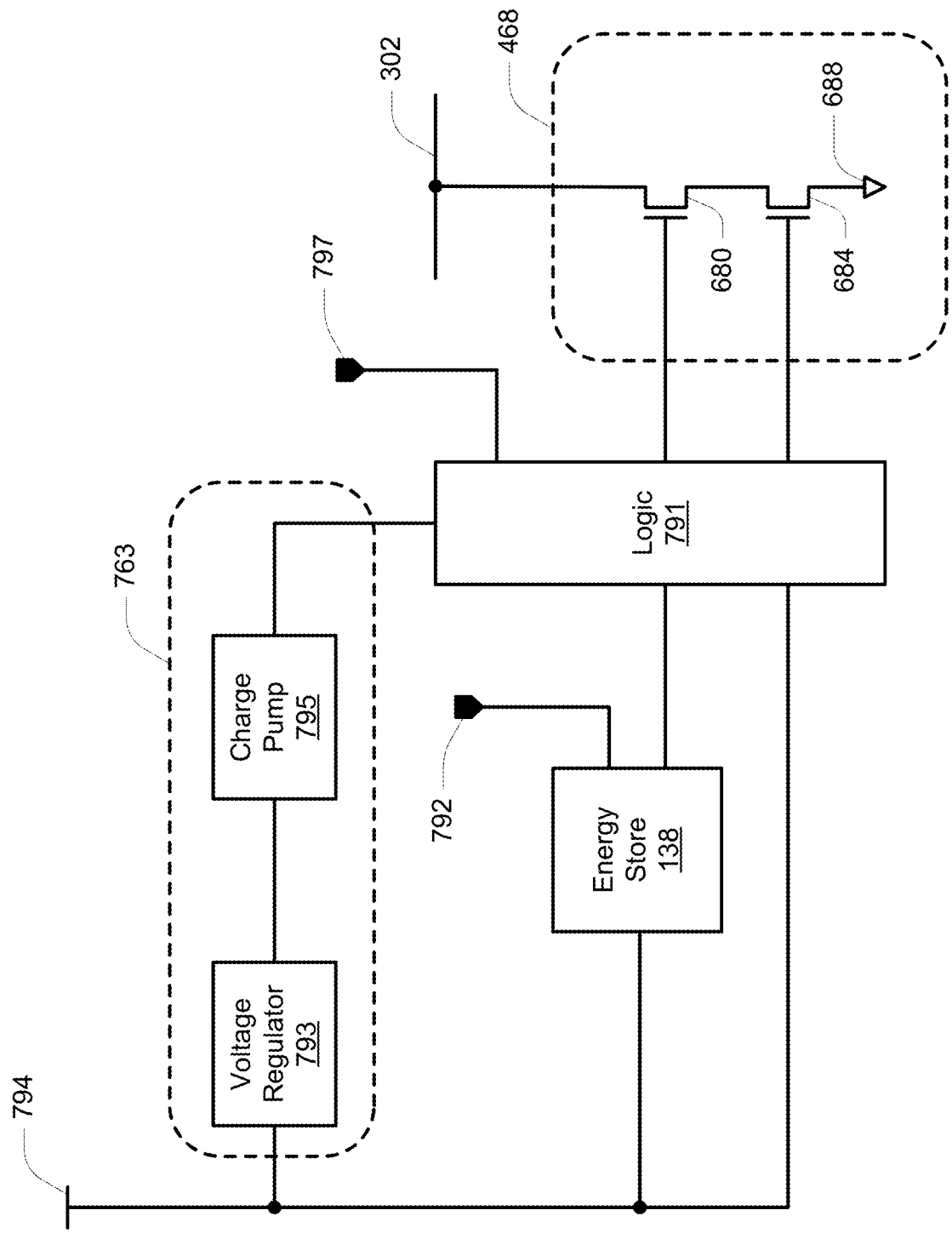

The schematic of FIG. 7D differs from FIG. 7C in that the logic 791 might be connected to the energy store 138 instead of the output of the voltage regulator 793. The logic 791 might again be configured to provide the voltage level of the output of the charge pump 795 to the control gate of the nFET 680 in response to the voltage level of the supply voltage node 794 decreasing to a voltage level lower than (or equal to) the first threshold, but might be configured to provide a voltage level of the energy store 138 to the control gate of the nFET 680 in response to the voltage level of the supply voltage node 794 decreasing (e.g., further decreasing) to a voltage level lower than (or equal to) the second threshold. In addition, the logic 791 might be configured to provide the voltage level of the supply voltage node 794 to the control gate of the nFET 684 until the voltage level of the supply voltage node 794 decreases to a voltage level lower than (or equal to) the second threshold, and configured to provide the voltage level of the energy store 138 to the control gate of the nFET 684 in response to the voltage level of the supply voltage node 794 decreasing to a voltage level lower than (or equal to) the second threshold.

Figure 8:
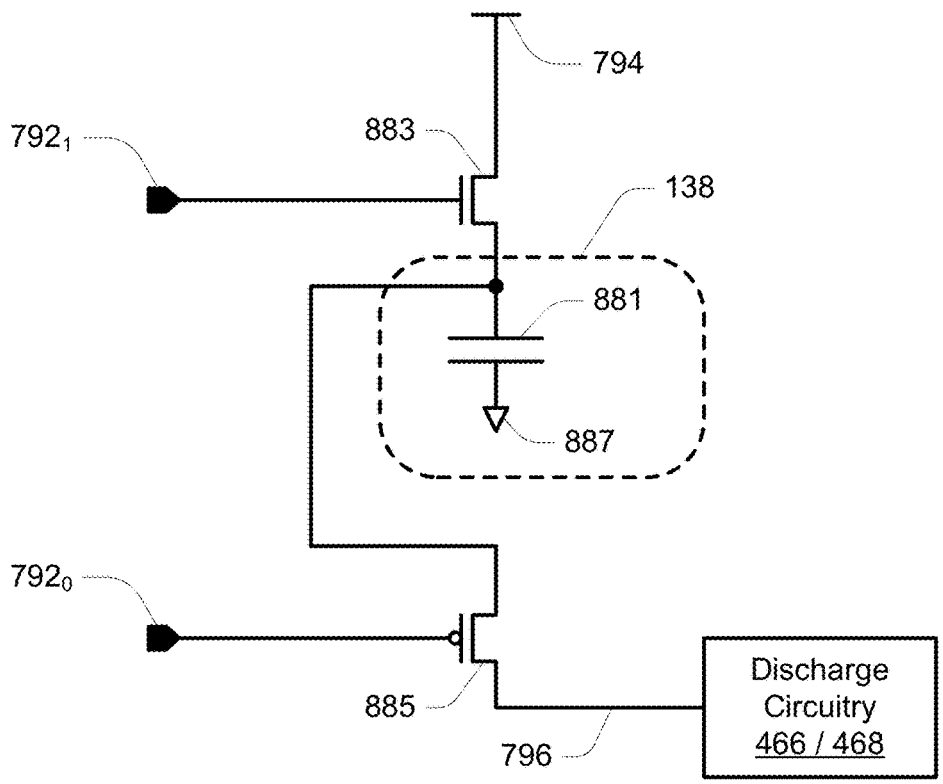
FIG. 8 is a schematic of an energy store selectively connected to a supply voltage node and selectively connected to discharge circuitry in accordance with an embodiment.

FIG. 8 is a schematic of an energy store selectively connected to a supply voltage node and selectively connected to discharge circuitry in accordance with an embodiment. The energy store 138 is depicted to include a capacitance, e.g., a capacitor 881. The capacitor 881 has a first electrode selectively connected to the supply voltage node 794 through a first transistor, e.g., nFET 883, and selectively connected to the discharge circuitry 466 or 468 through a second transistor, e.g., pFET 885. The capacitor 881 further has a second electrode connected to a voltage node 887, which might be configured to receive the reference potential, such as Vss, ground or 0V.

The energy store 138 might be configured to be connected to the supply voltage node 794 while the voltage level of the supply voltage node 794 is within its normal operating range. During this time, the energy store 138 might be configured to be disconnected from the discharge circuitry 466/468, such as by the control logic 116 generating the control signal $792_0$ to deactivate the transistor 885. In response to the voltage level of the supply voltage node 794 decreasing to a voltage level lower than (or equal to) the first threshold, the energy store 138 might be configured to be disconnected from (e.g., isolated from) the supply voltage node 794, such as by the control logic 116 generating the control signal $792_1$ to deactivate the transistor 883.

The energy store 138 might be configured to be disconnected from the discharge circuitry 466/468 while the voltage level of the supply voltage node 794 is within its normal operating range. In response to the voltage level of the supply voltage node 794 decreasing to a voltage level lower than (or equal to) the second threshold, the energy store 138 might be configured to be connected to the discharge circuitry 466/468, such as by the control logic 116 generating the control signal $792_0$ to activate the transistor 885.

Figure 9:
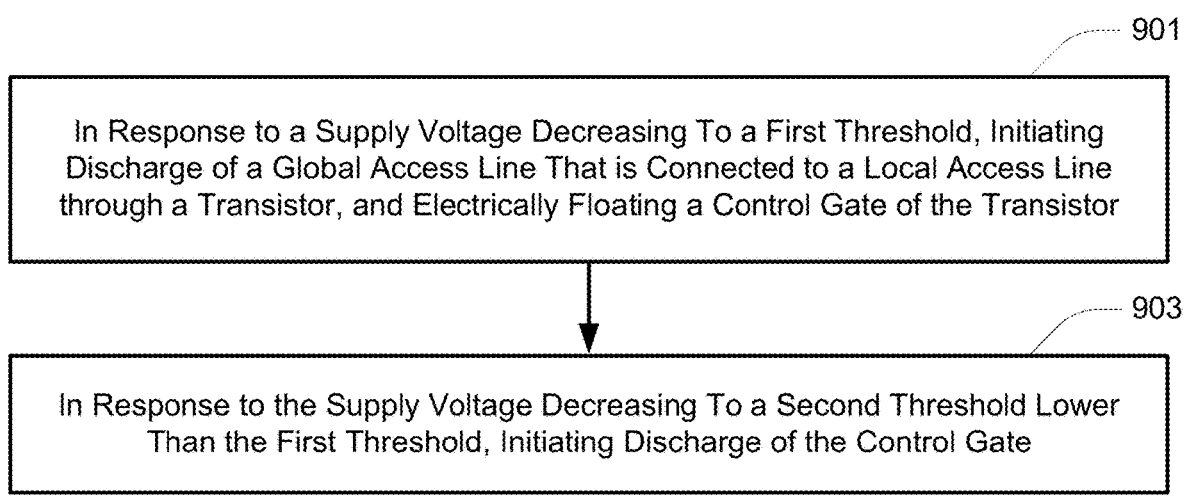
FIG. 9 is a flowchart of a method of operating a memory in accordance with an embodiment.

FIG. 9 is a flowchart of a method of operating a memory in accordance with an embodiment. The method of FIG. 9 might be performed where an access operation, e.g., a sense operation or a programming operation, is being performed when an asynchronous power less event occurs.

At 901, in response to a supply voltage decreasing to a voltage level lower than (or equal to) a first threshold, discharge of a global access line might be initiated. For example, discharge of the global access line might occur as described with reference to FIG. 7C or 7D. The global access line might be connected to a local access line through a transistor, e.g., a block select transistor. The local access line might be connected to a memory cell on which the access operation is being performed, or it might be connected to a memory cell of a string of series-connected memory cell containing the memory cell on which the access operation is being performed. In addition, the control gate of the transistor might be electrically floated. For example, with reference to FIG. 4, the control signal 452 might have a value, e.g., a logic low level, to deactivate the nFET 450, the voltage generation circuitry 462 might be deactivated or otherwise disconnected from the voltage node 456, and the discharge circuitry might be deactivated.

At 903, in response to the supply voltage decreasing to a voltage level lower than (or equal to) a second threshold lower than the first threshold, discharge of the control gate of the transistor might be initiated. For example, discharge of the control gate of the transistor might occur as described with reference to FIG. 7A or 7B. It is noted that the voltage level of the control gate of the block select transistor 344 might generally follow the discharge of the voltage node 456 through the pFET 458 switch while the voltage level of the voltage node 456 is above the voltage level of the control signal 460 plus the threshold voltage of the pFET 458, or through forward bias when the voltage level of the voltage node 456 is below the voltage level of the control signal 460 plus the threshold voltage of the pFET 458.

Figure 10A:
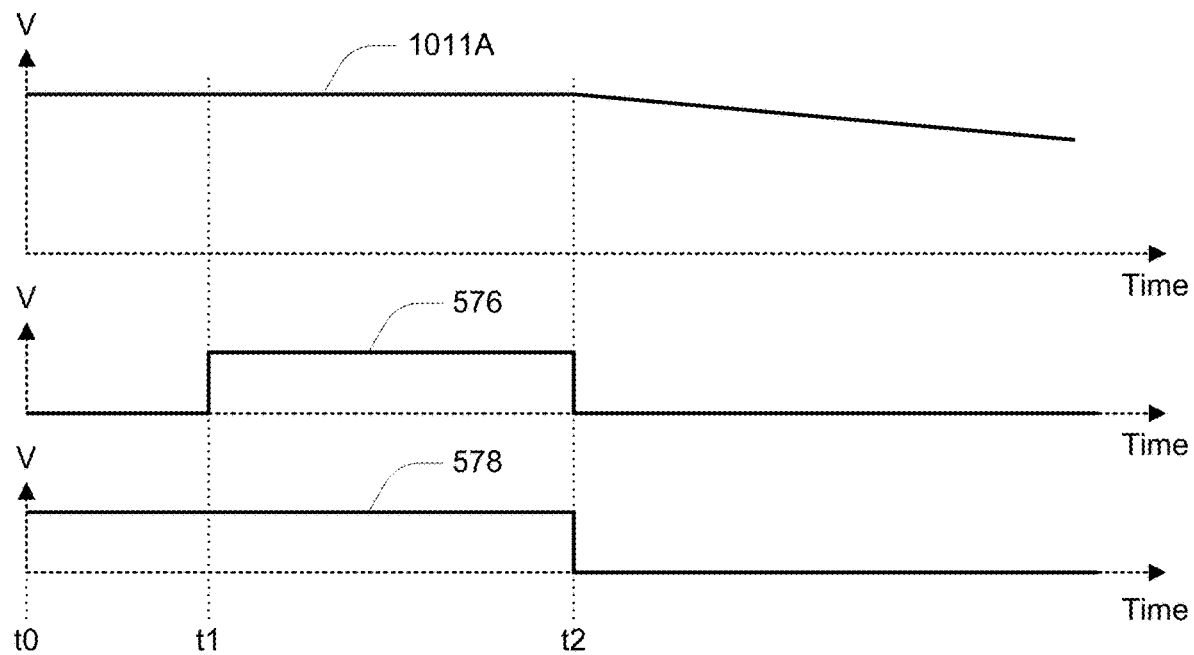
FIGS. 10A-10B depict timing diagrams of various embodiments in accordance with the method of FIG. 9.
Figure 10B:
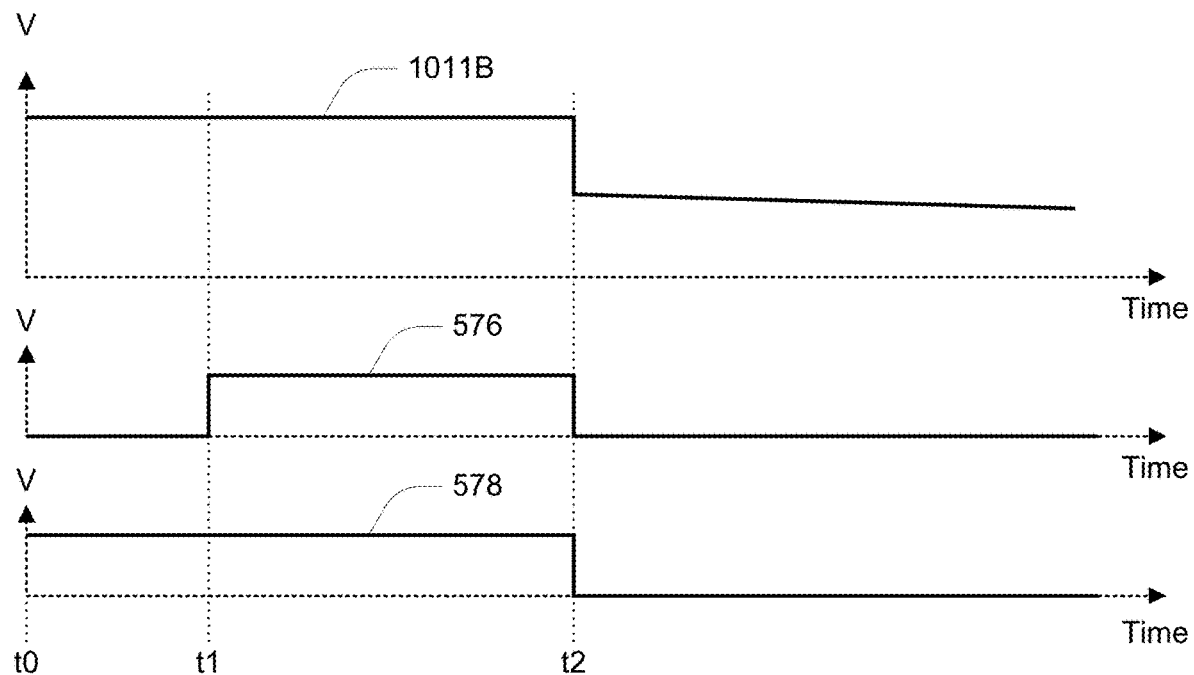

FIGS. 10A-10B depict timing diagrams of various embodiments in accordance with the method of FIG. 9. The example of FIG. 10A considers the discharge of the control gate of the transistor using the discharge scenario depicted in FIG. 7A, while the example of FIG. 10B considers the discharge of the control gate of the transistor using the discharge scenario depicted in FIG. 7B.

With reference to FIG. 10A, the time t0 might correspond to a time when asynchronous power loss occurs. The time t1 might correspond to a time when the voltage level of the supply voltage decreases to a voltage level lower than (or equal to) the first threshold, and the time t2 might correspond to a time when the voltage level of the supply voltage decreases to voltage level lower than (or equal to) the second threshold. Traces 576 and 578 might be as described with reference to FIG. 5. Trace 1011A might represent a voltage level of the voltage node 456, and thus might represent a voltage level of the control gate of the transistor.

At time t1, discharge of the global access line might be initiated and the control gate of the transistor might be electrically floated. As a result, trace 1011A might maintain its voltage level from time t0. At time t2, discharge of the control gate of the transistor might be initiated, such as by discharging the voltage node 456 through the discharge circuitry 466. This might result in a gradual decrease in the voltage level of trace 1011A.

With reference to FIG. 10B, the time t0 might correspond to a time when asynchronous power loss occurs. The time t1 might correspond to a time when the voltage level of the supply voltage decreases to a voltage level lower than (or equal to) the first threshold, and the time t2 might correspond to a time when the voltage level of the supply voltage decreases to voltage level lower than (or equal to) the second threshold. Traces 576 and 578 might be as described with reference to FIG. 5. Trace 1011B might represent a voltage level of the voltage node 456, and thus might represent a voltage level of the control gate of the transistor.

At time t1, discharge of the global access line might be initiated and the control gate of the transistor might be electrically floated. As a result, trace 1011B might maintain its voltage level from time t0. At time t2, discharge of the control gate of the transistor might be initiated, such as by discharging the voltage node 456 to the energy store 138. This might result in a sudden decrease in the voltage level of trace 1011B at time t2, followed by a gradual decrease upon reaching equilibrium with the energy store 138.

In both of the examples of FIGS. 10A and 10B, discharge of the global access lines, and thus discharge of the local access lines, might continue after time t2 as the voltage level of the control gate of the transistor, e.g., the block select transistor 344, might be maintained at a level sufficient to continue activation of the transistor.

Figure 11:
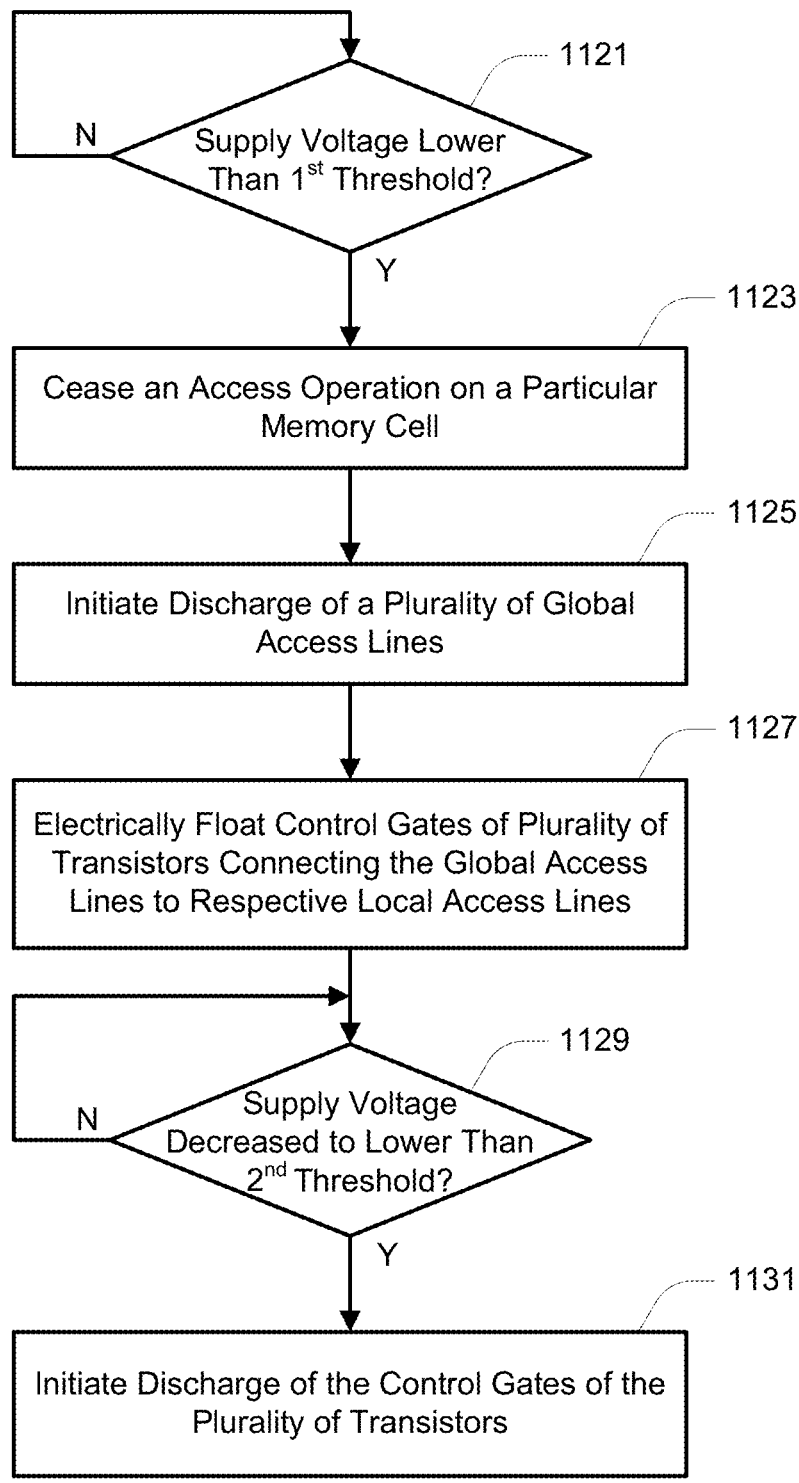
FIG. 11 is a flowchart of a method of operating a memory in accordance with another embodiment.

FIG. 11 is a flowchart of a method of operating a memory in accordance with another embodiment. The method of FIG. 11 might be performed where an access operation, e.g., a sense operation or a programming operation, is being performed when an asynchronous power less event occurs.

At 1121, it might be determined whether the supply voltage has a voltage level lower than a first threshold. This might further include determining whether the supply voltage has a voltage level lower than or equal to the first threshold. If the voltage level is lower than (or equal to) the first threshold, the method might proceed to 1123. If not, the method might return to 1121.

At 1123, the access operation on a particular memory cell might be ceased. At 1125, discharge of a plurality of global access lines might be initiated. The global access lines, and their respective local access lines used for the access operation, might be at elevated voltage levels. At 1127, control gates of a plurality of transistors connecting the plurality of global access lines to their respective local access lines might be electrically floated. Although 1123, 1125 and 1127 are depicted sequentially in FIG. 11, they might be performed concurrently.

At 1129, it might be determined whether the supply voltage has decreased to a voltage level lower than a second threshold. This might further include determining whether the supply voltage has a voltage level lower than or equal to the second threshold. If the voltage level is lower than (or equal to) the second threshold, the method might proceed to 1131. If not, the method might return to 1129. At 1131, discharge of the control gates of the plurality of transistors might be initiated.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A memory, comprising:
   a first voltage node configured to receive a supply voltage;
   a second voltage node configured to receive a reference potential;
   an array of memory cells;
   a local access line connected to a plurality of memory cells of the array of memory cells;
   a global access line;
   a first transistor connected between the global access line and the local access line;
   a second transistor connected between the second voltage node and a control gate of the first transistor; and
   an energy store selectively connected to the first voltage node and selectively connected to a control gate of the second transistor.

2. The memory of claim 1, wherein the energy store comprises circuitry configured to receive and store power selected from a group consisting of a capacitor and a rechargeable battery.

3. The memory of claim 1, further comprising:
   a controller for access of the array of memory cells, wherein the controller is configured to cause the memory to:
   apply a first voltage level to the global access line during an access operation on the plurality of memory cells;
   apply a second voltage level, higher than the first voltage level, to the control gate of the first transistor while applying the first voltage level to the global access line;
   initiate discharge of the global access line from the first voltage level, and maintain the control gate of the first transistor at the second voltage level, in response to the supply voltage decreasing to a first threshold; and
   initiate discharge of the control gate of the first transistor from the second voltage level in response to the supply voltage further decreasing to a second threshold lower than the first threshold.

4. The memory of claim 3, wherein the controller being configured to cause the memory to maintain the control gate of the first transistor at the second voltage level comprises the controller being configured to cause the memory to electrically float the control gate of the first transistor.

5. The memory of claim 4, wherein the controller being configured to cause the memory to discharge the control gate of the first transistor from the second voltage level comprises the controller being configured to cause the memory to connect the control gate of the second transistor to the energy store.

6. The memory of claim 3, wherein the controller is further configured to isolate the energy store from the first voltage node in response to the supply voltage decreasing to the first threshold, and to connect the energy store to the control gate of the second transistor in response to the supply voltage further decreasing to the second threshold.

7. The memory of claim 1, wherein the energy store comprises a capacitor having a first electrode selectively connected to the first voltage node and selectively connected to the control gate of the second transistor.

8. The memory of claim 7, wherein the memory further comprises:
   a third transistor connected between the second transistor and the second voltage node;
   wherein the first electrode of the capacitor is further selectively connected to a control gate of the third transistor.

9. A memory, comprising:
   a first voltage node configured to receive a supply voltage;
   a second voltage node configured to receive a reference potential;
   an array of memory cells;
   a local access line connected to a plurality of memory cells of the array of memory cells;
   a global access line;
   a transistor connected between the global access line and the local access line; and
   an energy store selectively connected to the first voltage node and selectively connected to a control gate of the transistor.

10. The memory of claim 9, wherein the transistor is a first transistor, the memory further comprising:

a second transistor connected between the global access line and the second voltage node;
wherein the energy store is further selectively connected to a control gate of the second transistor.

11. The memory of claim 9, further comprising:
a controller for access of the array of memory cells, wherein the controller is configured to cause the memory to:
apply a first voltage level to the global access line during an access operation on the plurality of memory cells;
apply a second voltage level, higher than the first voltage level, to the control gate of the first transistor while applying the first voltage level to the global access line;
initiate discharge of the global access line from the first voltage level, and maintain the control gate of the transistor at the second voltage level, in response to the supply voltage decreasing to a first threshold; and
initiate discharge of the control gate of the transistor from the second voltage level in response to the supply voltage further decreasing to a second threshold lower than the first threshold.

12. The memory of claim 11, wherein the controller being configured to cause the memory to discharge the control gate of the transistor from the second voltage level comprises the controller being configured to cause the memory to connect the control gate of the transistor to the energy store.

13. The memory of claim 11, wherein the controller is further configured to isolate the energy store from the first voltage node in response to the supply voltage decreasing to the first threshold.

14. The memory of claim 9, wherein the energy store comprises a capacitor having a first electrode selectively connected to the first voltage node and selectively connected to the control gate of the transistor.

15. A memory, comprising:
an array of memory cells;
a local access line connected to a plurality of memory cells of the array of memory cells;
a global access line;
a transistor having a control gate, having a first source/drain connected to the global access line and a second source/drain connected to the local access line; and
a controller, wherein the controller is configured to cause the memory to:
initiate discharge of the global access line and electrically float the control gate of the transistor in response to a supply voltage of the memory decreasing to a first threshold; and
initiate discharge of the control gate of the transistor in response to the supply voltage decreasing to a second threshold lower than the first threshold.

16. The memory of claim 15, wherein the controller being configured to cause the memory to initiate discharge of the global access line in response to the supply voltage decreasing to the first threshold comprises the controller being configured to cause the memory to initiate discharge of the global access line in response to the supply voltage decreasing to a voltage level lower than an operating range of the supply voltage.

17. The memory of claim 15, wherein the controller being configured to cause the memory to initiate discharge of the global access line in response to the supply voltage decreasing to the first threshold comprises the controller being configured to cause the memory to connect a control gate of a second transistor, connected between the global access line and a voltage node configured to receive a reference potential, to a voltage node selected from a group consisting of a supply voltage node of the memory, a regulated voltage node of the memory, and a generated voltage node of the memory.

18. The memory of claim 17, wherein the controller is further configured to cause the memory to connect the control gate of the second transistor to an energy store of the memory in response to the supply voltage decreasing to the second threshold.

19. The memory of claim 15, wherein the controller being configured to cause the memory to initiate discharge of the control gate comprises the controller being configured to cause the memory to connect the control gate of the transistor to an energy store of the memory.

20. The memory of claim 15, wherein the transistor is a first transistor, and wherein the controller being configured to cause the memory to initiate discharge of the control gate of the first transistor comprises the controller being configured to cause the memory to connect a control gate of a second transistor of the memory, connected between the control gate of the first transistor and a voltage node of the memory configured to receive a reference potential, to a voltage node selected from a group consisting of a supply voltage node of the memory, a regulated voltage node of the memory, and a generated voltage node of the memory.

* * * * *